(12) United States Patent
Hirooka

(10) Patent No.: US 6,700,089 B1
(45) Date of Patent: Mar. 2, 2004

(54) PLASMA PROCESSING DEVICE, ITS MAINTENANCE METHOD, AND ITS INSTALLATION METHOD

(75) Inventor: Takaaki Hirooka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/937,669

(22) PCT Filed: Mar. 29, 2000

(86) PCT No.: PCT/JP00/01939

§ 371 (c)(1),
(2), (4) Date: Sep. 28, 2001

(87) PCT Pub. No.: WO00/60653

PCT Pub. Date: Oct. 12, 2000

(30) Foreign Application Priority Data

Mar. 30, 1999 (JP) .............................................. 11/88153

(51) Int. Cl.[7] .............................................. B23K 10/00
(52) U.S. Cl. .............................. 219/121.4; 219/121.43; 219/121.52; 156/345.27
(58) Field of Search ........................ 219/121.4, 121.43, 219/121.52, 121.44; 156/345.47, 345.34, 345.46, 345.31, 345.27, 345.29; 204/298.31, 298.34, 192.32, 192.35

(56) References Cited

U.S. PATENT DOCUMENTS

| | | | |
|---|---|---|---|
| 4,585,920 A | | 4/1986 | Hoog et al. |
| 5,919,332 A | * | 7/1999 | Koshiishi et al. ...... 156/345.47 |
| 5,980,687 A | * | 11/1999 | Koshimizu ............. 156/345.29 |
| 6,072,147 A | * | 6/2000 | Koshiishi et al. ...... 219/121.43 |
| 6,171,438 B1 | * | 1/2001 | Masuda et al. ........ 156/345.27 |
| 6,245,190 B1 | * | 6/2001 | Masuda et al. ........ 156/345.46 |

FOREIGN PATENT DOCUMENTS

| | | |
|---|---|---|
| EP | 0 708 478 A1 | 4/1996 |
| JP | 05-332006 | 12/1993 |
| JP | 07-192896 | 7/1995 |
| JP | 07-193115 | 7/1995 |
| JP | 09-038481 | 2/1997 |

OTHER PUBLICATIONS

International Search Report.

* cited by examiner

Primary Examiner—Quang T. Van
(74) Attorney, Agent, or Firm—Finnegan, Henderson, Farabow, Garrett & Dunner, LLP

(57) ABSTRACT

An upper electrode unit constituting the upper wall of a processing chamber of an etching device includes a first assembly that includes an upper electrode, a second assembly that supports the first assembly and a third assembly that includes power supply routes. After releasing a second locking mechanism and disengaging the third assembly alone with a removing mechanism, the first assembly is disengaged to perform maintenance on the upper electrode. After locking the second locking mechanism and releasing a first locking mechanism, the removing mechanism is utilized to disengage the second and third assemblies and, as a result, the processing chamber is opened to enable maintenance. By adopting the structure described above, a plasma processing device and a maintenance method thereof, that facilitate maintenance and reduce the workload imposed on the operator, are provided.

8 Claims, 11 Drawing Sheets

PLASMA PROCESSING DEVICE, ITS MAINTENANCE METHOD, AND ITS INSTALLATION METHOD

TECHNICAL FIELD

The present invention relates to a plasma processing device, and a maintenance method and an installation method thereof.

BACKGROUND ART

Plasma processing devices are widely used during the process of manufacturing semiconductor devices in the prior art. A plasma processing device includes an upper electrode and a lower electrode facing opposite each other inside an air-tight processing chamber. During the process, high-frequency power is applied to the upper electrode to generate plasma from a processing gas induced into the processing chamber. Thus, a specific type of plasma process is implemented on a workpiece placed on the lower electrode.

An upper electrode unit at which the upper electrode is provided assumes a complex structure having a shield box in which a power supply member such as a power supply rod for supplying the high-frequency power to the upper electrode is housed, a matching box in which a matcher and the like are housed, a processing gas supply system and the like assembled as an integrated unit. Accordingly, the upper electrode unit as a whole becomes large and heavy.

This necessitates the operator to perform maintenance work such as cleaning the upper electrode and the inside of the processing chamber after disassembling the upper electrode unit into members with weights and in sizes that allow for easier handling. In addition, when the maintenance work is completed, the individual members must be reassembled into the upper electrode unit.

As described above, the device must be disassembled and reassembled each time maintenance work is performed in the prior art. This poses a problem of lowered device operating efficiency. In addition, the disassembled members must be accurately aligned during the reassembly process. Such a process is bound to be complicated and time-consuming. The shield box and the matching box are normally set at high positions that are hard for the operator to access. As a result, the operator is forced to assume an uncomfortable posture when mounting or dismounting the members. Thus, there is a problem in that a great onus is placed on the operator.

In addition, numerous piping systems and wirings such as a processing gas supply system, and an evacuating system, a cooling water circulating system and a power supply system are usually connected to the processing device. When installing such a processing device at a semiconductor manufacturing plant or the like, it is crucial to reduce the length of time required for the installation work by efficiently connecting the piping systems and the wirings. However, the pipings and the wirings are connected after delivering the device to the installation site.

The present invention has been completed by addressing the problems of the prior art discussed above. An object of the present invention is to provide a new and improved plasma processing device that addresses the problems discussed above and problems other than those discussed above and a maintenance method and an installation method thereof.

DISCLOSURE OF THE INVENTION

In order to achieve the object described above, in a first aspect of the present invention, a plasma processing device having a processing chamber in which a plasma process is implemented on a workpiece and an upper electrode unit constituting the upper wall of the processing chamber, which is characterized in that the upper electrode unit is capable of vacuum-locking the processing chamber by using its own weight and the difference between the pressure inside the processing chamber and the pressure outside the processing chamber without having to employ a means for locking, is provided.

According to the present invention, the upper electrode unit vacuum locks the processing chamber without utilizing a means for locking. When this structure is adopted, the processing chamber can be opened by simply removing the upper electrode unit. In addition, by placing the upper electrode unit on the processing chamber and reducing the pressure inside the processing chamber to a pressure lower than the pressure outside the processing chamber, the upper electrode unit is placed in air-tight contact with the wall of the processing chamber due to the weight of the upper electrode unit and the difference between the pressure inside the processing chamber and the pressure outside the processing chamber. As a result, a high degree of air-tightness is assured inside the processing chamber. As described above, the processing chamber can be opened and then sealed easily and quickly. Consequently, the onus on the operator is reduced and, in addition, the length of time required for performing maintenance inside the processing chamber is reduced as well.

In a second aspect of the present invention, a plasma processing device having a processing chamber in which a plasma process is implemented on a workpiece and an upper electrode unit constituting the upper wall of the processing chamber, which is characterized in that the upper electrode unit is constituted of a plurality of assemblies including, at least, one assembly capable of vacuum-locking the processing chamber by using its own weight and the difference between the pressure inside the processing chamber and the pressure outside the processing chamber without having to employ a means for locking and another assembly on which the one assembly can be placed, is provided.

According to the present invention, the upper electrode unit is constituted of a plurality of members to facilitate work performed by the operator. Thus, the heavy upper electrode unit can be disengaged in separate parts. This structure further reduces the onus placed on the operator. In addition, the one assembly is placed on the other assembly. As a result, the weight of the one assembly in addition to the difference between the pressure inside the processing chamber and the pressure outside the processing chamber allows the one assembly to be placed in air-tight contact with the other assembly. Consequently, the degree of air-tightness between the one assembly and the other assembly is improved.

It is desirable to include a first assembly having an electrode for supplying high-frequency power into the processing chamber or a grounded electrode, a second assembly that holds the first assembly and a third assembly having a high-frequency power supply path or a grounding path in the upper electrode unit. In this structure, the upper electrode unit is constituted of integrated assemblies that facilitate work performed by the operator. As a result, the upper electrode unit can be mounted and dismounted with ease and its maintenance is facilitated as well.

In addition, it is desirable to constitute the one assembly as the first assembly and the other assembly as the second assembly. This structure allows maintenance on the electrode to be performed with ease.

Under normal circumstances, the third assembly weighs more than the first assembly or the second assembly. For this reason, it is desirable to constitute the one assembly as the third assembly and the other assembly as the first assembly. When this structure is adopted, the processing chamber can be vacuum-locked with a higher degree of reliability by using the weight of the third assembly.

In a third aspect of the present invention, a plasma processing device having a processing chamber in which a plasma process is implemented on a workpiece and an upper electrode unit constituting the upper wall of the processing chamber, which is characterized in that a removing mechanism utilized to disengage the upper electrode unit from the processing chamber is provided, in that the upper electrode unit is constituted of a plurality of assemblies and in that the removing mechanism is capable of disengaging at least one assembly among the plurality of assemblies by itself and also capable of disengaging at least two assemblies among the plurality of assemblies together as an integrated member, is provided.

In this structure, an assembly that is harder for the operator to work on, for instance, can be disengaged by employing the removing mechanism. As a result, the onus placed on the operator is reduced. In addition, depending upon the type of maintenance being performed, an assembly can be disengaged by itself or a plurality of assemblies can be disengaged together as necessary. Consequently, the maintenance work can be performed with a high degree of efficiency within a short period of time.

It is desirable to allow at least one assembly to be mounted detachably at the processing chamber by employing a first locking mechanism. In this structure, by opening/closing the first locking mechanism, the one assembly can be mounted/dismounted with ease. In addition, the position of the one assembly can be determined by the first locking mechanism. As a result, the one assembly can be set in air-tight contact at the processing chamber with a high degree of reliability. Thus, a high degree of air-tightness is assured inside the processing chamber.

In addition, it is desirable to allow at least two assemblies to be detachably assembled with each other by employing a second locking mechanism. In this structure, the individual assemblies can be mounted/dismounted and their positions can be determined with ease and accuracy. Furthermore, by locking the second locking mechanism, the two assemblies can be mounted/dismounted as an integrated unit. When the second locking mechanism is released, either one of the assemblies can be mounted/dismounted by itself.

It is desirable to include a first assembly having an electrode for supplying high-frequency power into the processing chamber or a grounded electrode, a second assembly that holds the first assembly and a third assembly having a high-frequency power supply path or a grounding path in the upper electrode unit.

In a fourth aspect of the present invention, a method for performing maintenance on a plasma processing device having a processing chamber in which a plasma process is implemented on a workpiece, an upper electrode unit constituting the upper wall of the processing chamber and a removing mechanism used to disengage the upper electrode unit from the processing chamber with the upper electrode unit having at least a first assembly, a second assembly and a third assembly, which comprises a step in which the third assembly is secured to the removing mechanism and is disengaged, a step in which the first assembly is disengaged without using the removing mechanism, a step in which the third assembly and the second assembly are assembled together as an integrated unit, a step in which the third assembly coupled with the second assembly is secured to the removing mechanism and is disengaged and a step in which maintenance work is performed on at least one of; the first assembly, the second assembly, the third assembly and the processing chamber, is provided.

According to the present invention, after disengaging the large third assembly with relatively great weight which includes, for instance, a power supply path through which the high-frequency power is supplied or a grounding path with the removing mechanism, the relatively small first assembly with relatively little weight which includes, for instance, an electrode for supplying the high-frequency power into the processing chamber or a grounded electrode can be disengaged. Thus, the operator can perform maintenance on, for instance, the first assembly through a simple operation without having to disassemble the upper electrode unit into separate parts. In addition, after disengaging the first assembly, the second assembly having relatively great weight and a relatively large size that holds the first assembly, for instance, can be disengaged together with the third assembly by utilizing the removing mechanism. As a result, maintenance work can be performed inside the processing chamber, for instance, through a simple operation and the onus on the operator can be reduced. Furthermore, the reassembly process to be performed when the maintenance work is completed is facilitated.

In a fifth aspect of the present invention, a method for performing maintenance on a plasma processing device having a processing chamber in which a plasma process is implemented on a workpiece, an upper electrode unit constituting the upper wall of the processing chamber and a removing mechanism used to disengage the upper electrode unit from the processing chamber with the upper electrode unit having at least a first assembly and a second assembly, which comprises a step in which the first assembly is secured to the removing mechanism and is disengaged, a step in which the second assembly is disengaged without using the removing mechanism, a step in which maintenance work is performed on the disengaged second assembly, a step in which the second assembly having been serviced is reinstalled to the original position without using the removing mechanism and a step in which the first assembly secured to the removing mechanism is reinstalled to the original position, is provided.

According to the present invention, after the first assembly which includes, for instance, a supply path through which the high-frequency power is supplied or a grounding path is disengaged by using the removing mechanism, the second assembly that includes, for instance, an electrode for supplying the high-frequency power into the processing chamber or a grounded electrode can be disengaged. Thus, the second assembly can be serviced through a simple operation. In addition, after remounting the second assembly having undergone the maintenance process, the first assembly can be reinstalled at the original mounting position by using the removing mechanism. As a result, the onus placed on the operator after the maintenance work on the second assembly is completed is reduced.

In a sixth aspect of the present invention, a plasma processing device having a processing chamber in which a plasma process is implemented on a workpiece and a base frame on which the processing chamber is set, which is characterized in that the base frame includes a link piping having a means for switching and in hat the piping type links a pipe connected to a fluid supply source from which a fluid to be used in the processing chamber is supplied to a pipe connected to the processing chamber, is provided.

According to the present invention, the link piping is provided in the base frame. Thus, before the main device is installed, e.g., while the main device is being manufactured, the installation of the base frame and the piping work between the link piping at the base frame and the supply source can be completed. Then, the final piping process can be performed simply by connecting the link piping and the processing chamber through piping after installing the device at the base frame. As a result, the piping process is facilitated and also a reduction in the length of time required for the installation is achieved. In addition, as long as the means for switching is closed, the fluid does not leak even if the fluid is supplied to the link piping in advance prior to the installation of the main device. Consequently, the fluid can be supplied promptly after the piping becomes connected to the processing chamber. This means that the device is allowed to enter an operating state without a great delay. It is to be noted that the processing chamber as referred to in this description includes all the spaces at various devices installed on the base frame and used during the semiconductor manufacturing step during which various types of pipings become connected, including the delivery chamber of the delivery device which delivers the workpiece, as well as the processing chamber itself, in which the plasma process is implemented on the workpiece. Furthermore, the fluid as referred to in the description may be any substance distributed via a piping including a gas such as a processing gas or a liquid such as cooling water.

It is also desirable to provide a link wiring having an on/off means at the base frame, to link a wiring connected to a power source that provides power to be applied to the plasma processing device to a wiring connected to the plasma processing device. By adopting this structure, the wirings can be connected in a manner similar to that with which the pipings are connected as described above.

In a seventh aspect of the present invention, a method for installing a plasma processing device having a processing chamber in which a plasma process is implemented on a workpiece and a base frame on which the processing chamber is placed with the base frame having a link piping provided with a means for switching and the link piping used to link a pipe connected to a fluid supply source from which a fluid to be used in the processing chamber is supplied to a pipe connected to the processing chamber, which comprises a first step in which the base frame is secured onto the base on which the processing chamber is placed, a second step implementation after the first step, in which the pipe connected to the fluid supply source from which the fluid to be used in the processing chamber is supplied is connected to the link piping, a third step implemented after the second step, in which the processing chamber is secured to the base frame and a fourth step implemented after the third step, in which the pipe connected to the processing chamber is connected to the link piping, is provided.

According to the present invention, the plasma processing device having the base frame can be installed speedily over a shorter period of time.

It is even more desirable to provide a link wiring having an on/off means at the base frame to link a wiring connected to a power source that provides power to be applied to the plasma processing device to a wiring connected to the plasma processing device, implement a step in which the wiring connected to the power source that provides the power to be applied to the plasma processing device is connected to the link wiring during the third step and implement a step in which the wiring connected to the plasma processing device is connected to the link wiring during the fourth step. Through this method, the wirings can be connected through a process similar to that implemented to connect the pipings.

BEST MODE FOR CARRYING OUT THE INVENTION

The following is a detailed explanation of the preferred embodiments of the plasma processing device and the methods for performing maintenance on and installing the plasma processing device according to the present invention, given in reference to the attached drawings.

First Embodiment

First, in reference to FIGS. 1~6, a first embodiment in which the plasma processing device and the maintenance method according to the present invention are adopted in a plasma etching device and a maintenance method thereof is explained.

(1) Overall Structure of Etching Device

Figure 1:
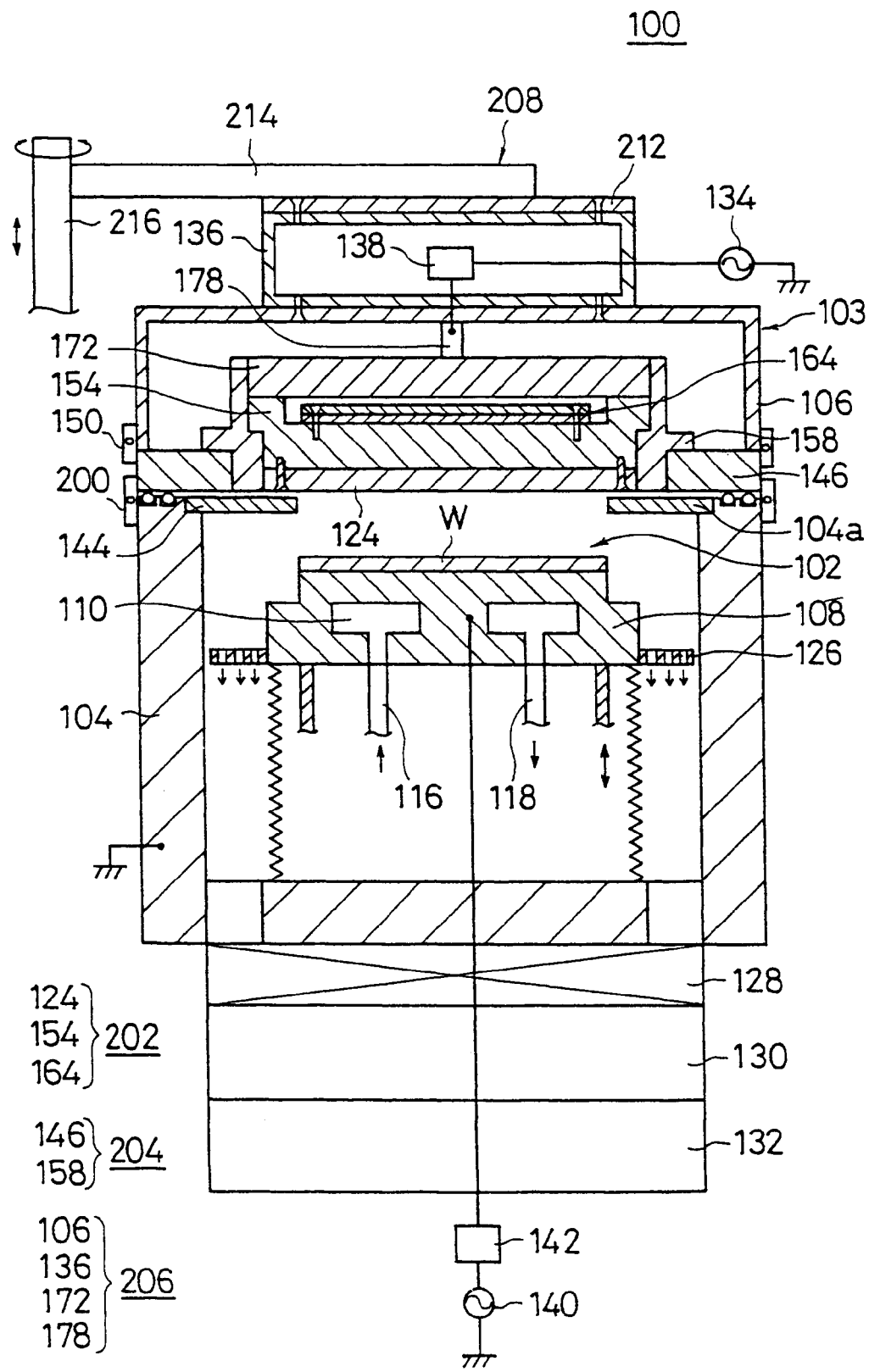
FIG. 1 is a schematic sectional view of an etching device that may adopt the present invention.

The structure of an etching device 100 is briefly explained. As illustrated in FIG. 1, a processing chamber 102 is provided in a conductive processing container 104 which is formed in a roughly cylindrical shape with an open top. At the ceiling of the processing chamber 102, an upper electrode unit 103 is mounted by assuring a high degree of air-tightness. A conductive lower electrode 108 is provided inside the processing chamber 102. The lower electrode 108 is formed so as to allow a workpiece such as a semiconductor wafer (hereafter referred to as a "wafer") W to be placed on it. In addition, the lower electrode 108 is internally provided with a coolant circulating passage 110. Through the coolant circulating passage 110, a coolant which cools the wafer W to sustain the temperature of the wafer W at a specific level circulates.

A detailed explanation is to be given later on the structure and the operation of the upper electrode unit 103 which constitutes the core of the present invention. It is to be noted that high frequency power output from a high frequency power source 134 is supplied to the upper electrode unit 103 via a matcher 138. The high-frequency power may have a frequency of, for instance, 13.56 MHz. High-frequency power output from a high-frequency power source 140 is supplied to the lower electrode 108 via a matcher 142. The frequency of the high-frequency power may be, for instance, 380 KHz. Through this power application, a processing gas induced into the processing chamber 102 is raised to plasma. As a result, a specific type of etching process is implemented on the wafer W with the plasma.

In addition, a shield ring 144 is provided inside the processing chamber 102. The shield ring 144 constituted of a dielectric material such as quartz covers the ceiling of the processing chamber 102 excluding the upper electrode 124. By assuming such a structure, it becomes possible to prevent the ceiling of the processing chamber 102 from becoming worn down by the impact of the plasma. It is to be noted that the shield ring 144 is fitted so as to interlock the outer edge of the shield ring 144 at a staged portion 104a formed at the inner edge of the top of the processing container 104.

An evacuating baffle plate 126 is provided around the lower electrode 108. The evacuating baffle plate 126 allows the gas inside the processing chamber 102 to be evacuated as necessary by a turbo-molecular pump 132 via a switching valve 128 and an evacuating quantity control valve 130.

The etching device 100 in the embodiment is constituted of the main components described above. Next, a detailed explanation is given on the structure of the upper electrode unit 103 constituting the core of the present invention.

(2) Structure of Upper Electrode Unit

Figure 2:
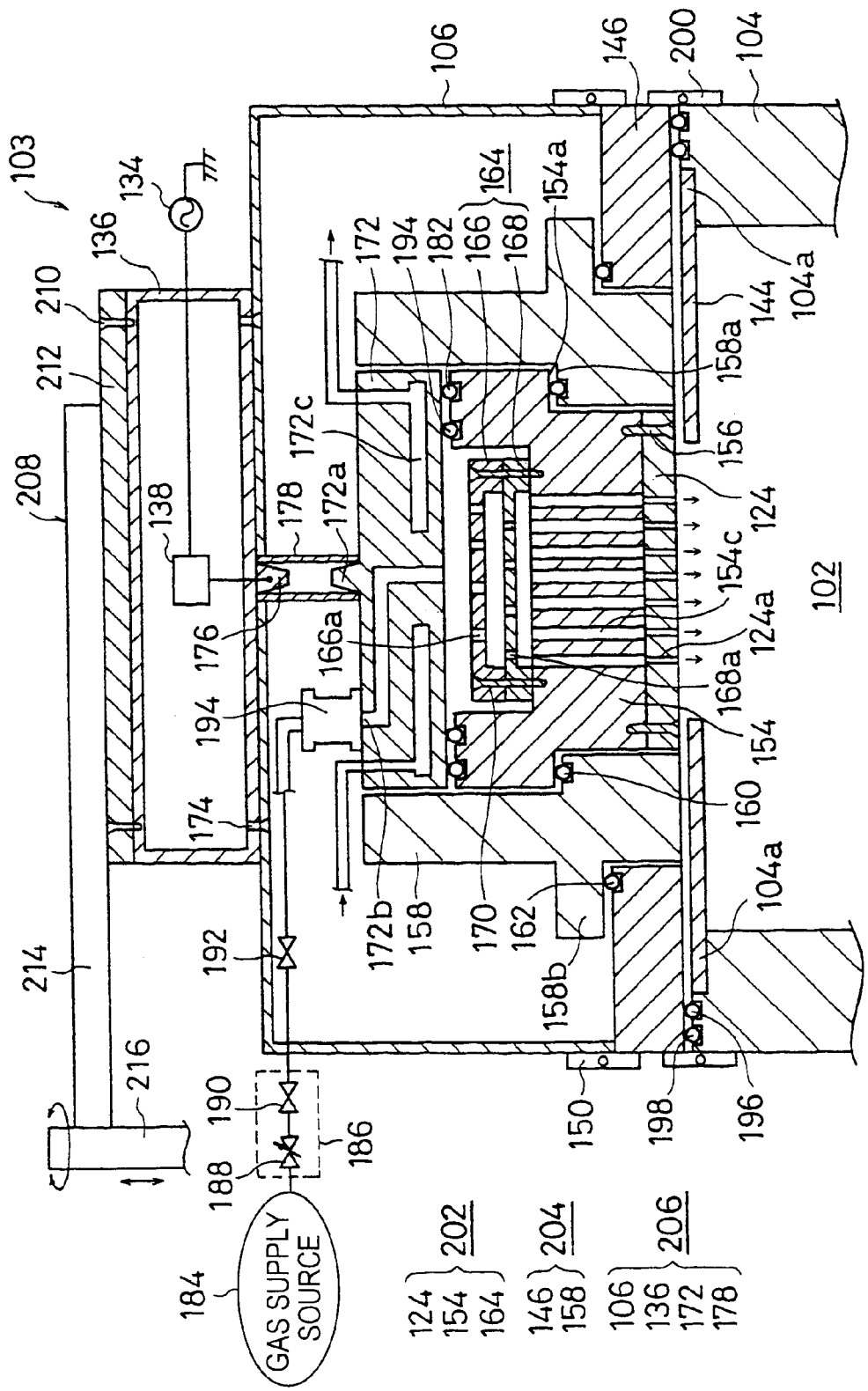
FIG. 2 is an enlarged schematic sectional view of the upper electrode unit of the etching device shown in FIG. 1.

As illustrated in FIG. 2, the upper electrode unit 103 mainly comprises first~third assemblies 202, 204 and 206. It is to be noted that the first assembly 202 is constituted of the upper electrode 124, a cooling plate 154 and a baffle plate 164. The second assembly 204 is constituted of a supporting plate 146 and an insulator 158. The third assembly 206 is constituted of a shield box 106, a matching box 136, a power supply rod 178 and an electro-body 172. The following is an explanation of the structure adopted in each assembly.

(a) Structure of First Assembly

First, the structure adopted in the first assembly 202 is explained. The upper electrode 124 constituting the first assembly 202 may be formed by using, for instance, silicon or aluminum having undergone an anodizing treatment, and is formed in a roughly disk shape. In addition, a plurality of gas outlet holes 124a are formed at the upper electrode 124. The processing gas is supplied into the processing chamber 102 through the gas outlet holes 124a. The cooling plate 154 is mounted on top of the upper electrode 124 by using fastening members 156 such as screws or bolts. Through the cooling plate 154, power is delivered to the upper electrode 124 and also the heat generated at the upper electrode 124 during the process is communicated to the electro-body 172 which is to be detailed later. The cooling plate 154, which is constituted of, for instance, aluminum having undergone an anodizing treatment, is formed in a roughly cylindrical shape. A staged portion 154a is formed at the outer circumference of the cooling plate 154. The staged portion 154a is formed so as to interlock with a staged portion 158a formed at the insulator 158 which is to be detailed later. A space in which the baffle plate 164 for diffusing the processing gas is to be housed is formed toward the top of the cooling plate 154.

The baffle plate 164 is constituted of a first baffle plate 166 and a second baffle plate 168 each constituted of aluminum having undergone an anodizing treatment and formed in a roughly disk shape. In addition, the baffle plate 164 is fastened inside the upper space at the cooling plate 154 by fastening members 170. Through holes 166a and 168a are formed respectively at the upper baffle plate 166 and the lower baffle plate 168. In such a structure, the processing gas having travelled through the baffle plate 164 is supplied to the gas outlet holes 124a via gas supply paths 154c formed at the cooling plate 154.

(b) Structure of Second Assembly

Next, the structure adopted in the second assembly 204 is explained. The supporting plate 146, which is a component of the second assembly 204, constitutes part of the ceiling of the processing chamber 102 and supports the first and third assemblies 202 and 206 provided over the processing chamber 102. The supporting plate 146, which is constituted of, for instance, aluminum having undergone an anodizing treatment, is formed in a roughly toroidal shape. In addition, the supporting plate 146 and the processing container 104 are detachably secured to each other by a first locking mechanism 200 such as a buckling mechanism. The first locking mechanism 200 also achieves a function of determining the position of the second assembly 204. Thus, once the first locking mechanism 200 is secured, the second assembly 204 is positioned at a specific position on the processing chamber 102 and becomes secured. Such a structure simplifies the process of positioning the second assembly 204. As a result, the second assembly 204 is mounted quickly. O rings 196 and 198 are provided between the supporting plate 146 and the processing container 104. The O-ring 196 is provided to maintain air-tightness. The O-ring 198 assures electrical conductivity.

In addition, the insulator 158 is fitted at the inner edge of the supporting plate 146. The insulator 158 is provided to insulate the first assembly 202 and the electro-body 172 constituting the third assembly 206 to be detailed later from the supporting plate 146. The insulator 158, which may be constituted of, for instance, ceramic, is formed in a roughly cylindrical shape so as to enclose the outer circumferences of the first assembly 202 and the electro-body 172. The insulator 158 is detachably supported by the supporting plate 146 at its projecting portion 158b formed at the outer circumference of the insulator 158 that interlocks with the inner edge of the supporting plate 146. In addition, an O-ring 162 is provided between the projecting portion 158b and the supporting plate 146. The staged portion 158a is formed inside the insulator 158. The staged portion 158a is provided to detachably support the first assembly 202 inserted at the insulator 158 by interlocking with the staged portion 154a formed at the cooling plate 154 mentioned earlier. Thus, once the first assembly 202 is inserted at the insulator 158, the first assembly 202 is set at a specific position. An O-ring 160 is provided between the staged portion 154a and the stage portion 158a.

(c) Structure of Third Assembly

The structure of the third assembly 206 is now explained. The shield box 106, which is a component of the third assembly 206, prevents the high-frequency power from leaking to the outside of the etching device 100. The shield box 106, which may be constituted of, for instance, stainless steel, is formed in a roughly cylindrical shape so as to enclose the periphery of the power supply rod 178, the electro-body 172 and the first and second assemblies 202 and 204. The shield box 106 also functions as a cover that covers the various mechanical units such as the first assembly 202.

The shield box 106 is set on the supporting plate 146. The shield box 106 is secured by a second locking mechanism 150, which detachably locks the shield box 106 to the supporting plate 146. The second locking mechanism 150 also achieves a function of determining the position of the third assembly 206. Thus, once the second locking mechanism 150 is secured, the third assembly 206 is set at a specific position at the second assembly 204 and becomes secured. Such a structure facilitates the process of positioning the third assembly 206. As a result, the third assembly 206 can be mounted quickly. In addition, the shield box 106 is grounded via the supporting plate 146 and the processing container 104.

The matching box 136 is set on the shield box 106. The matching box 136, which may be constituted of, for instance, stainless steel, houses the matcher 138. In addition, the matching box 136 is secured to the shield box 106 by fastening members 174. At the bottom of the matching box 136, an output unit 176 of the matcher 138, which is constituted as a projection protruding into the shield box 106 is secured via an insulating member (not shown). The power supply rod 178 for communicating high-frequency power to the first assembly 202 is connected to the output unit 176.

The power supply rod 178 may be constituted of, for instance, a stainless steel member formed in a roughly tubular shape. The power supply rod 178 is connected to the output unit 176 and an input unit 172a formed at the electro-body 172. An electrically conductive multi-plane contact (not shown) achieving elasticity is provided between the power supply rod 178 and the output unit 176 and between the power supply rod 178 and the input unit 172a. The output unit 176 of the matcher 138 is secured to the upper end of the power supply rod 178 via screws (not shown). The input unit 172a of the electro-body 172 is secured care the lower end of the power supply rod 178 via a pin or the like (not shown) in such a manner that a movement over approximately several mm is allowed along the vertical direction. When the third assembly 206 is set on the first assembly 202 in this structure, the electro-body 172 is placed in air-tight contact with the cooling plate 154 due to its own weight. As a result, a high degree of air-tightness is assured in the processing chamber 102.

In addition, the cooling plate 154 is placed in air-tight contact with the insulator 158 by the weight of the electro-body 172 and the first assembly 202. The insulator 158, in turn, is placed in air-tight with the supporting plate 146 by the weight of the electro-body 172 and the first assembly 202 and also by its own weight. The supporting plate 146 is then placed in air-tight contact with the processing container 104 by the weight of the first and third assemblies 202 and 206 and the weight of the insulator 158 and also by its own weight. As a result, the individual members are placed in air-tight contact with each other to assure a high degree of air-tightness in the processing container 104. By performing evacuation in the processing container 104, an even higher degree of air-tight contact is achieved between the cooling plate 154 and the insulator 158, between the insulator 158 and the supporting plate 146 and between the supporting plate 146 and the processing container 104 due to the difference between the air pressure inside the processing container 104 and the air pressure outside the processing container 104. Consequently, the degree of air-tightness in the processing container 104 is further improved.

As explained earlier, the electro-body 172 is provided to deliver the high-frequency power to the first assembly 202. The electro-body 172 may be a member achieved by forming anodized aluminum, for instance, in a roughly disk shape. The electro-body 172 is formed in a size which allows it to be housed within the insulator 158. Thus, the outer circumference of the electro-body 172 becomes enclosed by the insulator 158 when it is mounted.

The electro-body 172 is internally provided with a gas supply path 172b. As a result, when it is mounted, the processing gas supplied from a gas supply source 184 such as a fluorocarbon gas is supplied to the baffle plate 164 via a flow-regulating valve 188 and a switching valve 190 housed inside a gas box 186 and a switching valve 192, a gas inlet 194 and the gas supply path 172b provided inside the shield box 106. The electro-body 172 is also internally provided with a coolant circulating passage 172c. Through the coolant circulating passage 172c, the coolant circulates. The coolant absorbs the heat generated at the upper electrode 124 during the process. As a result, the temperature of the upper electrode 124 is sustained at a predetermined level. An O-ring 195 for sustaining the air-tightness and an electrically conductive O-ring 182 for assuring electrical conductivity are provided between the electro-body 172 and the cooling plate 154.

(d) Structure of Removing Mechanism

Next, the removing mechanism 208 is explained. The removing mechanism 208 is provided to move the third assembly 206 by itself from its mounting position are to move the third assembly 206 and the second assembly 204 as an integrated unit from their mounting positions in order to disengage the third assembly 206 or the integrated unit constituted of the third assembly 206 and the second assembly 204 from the etching device 100. The removing mechanism 208 comprises a plate unit 212, an arm unit 214 and a drive shaft 216 which is connected to a drive mechanism (not shown). The plate unit 212 is fastened to the matching box 136 by fastening members 210. The arm unit 214 supports the plate unit 212. The drive shaft 216 causes the plate unit 212 to travel along the vertical direction or to rotate along the horizontal direction via the arm unit 214. It is to be noted that the operation of the removing mechanism 208 and the structure adopted to achieve mounting/dismounting operations of the second and third assemblies 204 and 206 are to be detailed later.

(3) Structure Adopted to Allow Mounting/Dismounting of First~Third Assemblies

Next, in reference to FIGS. 3~6, a detailed explanation is given on the structure adopted to allow mounting/dismounting of the first~third assemblies 202, 204 and 206. The explanation given below focuses on an example for performing maintenance on the upper electrode 124 and inside the processing chamber 102. FIGS. 3(a), 4(a), 5(a) and 6(a) present schematic perspectives of the entire etching device 100, whereas FIGS. 3(b), 4(b), 5(b) and 6(b) present an enlarged schematic sectional views of the area around the shield box 106.

Figure 3A:
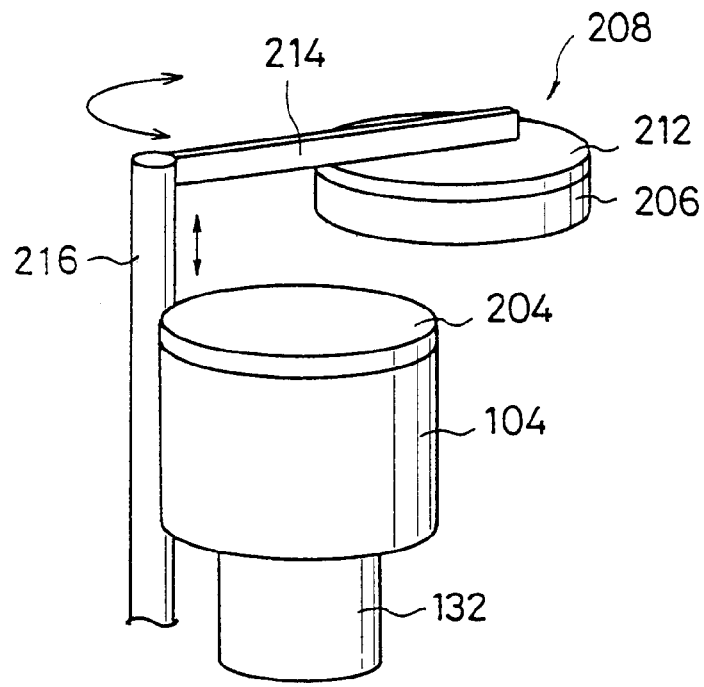
FIG. 3 schematically illustrates a step implemented to perform maintenance on the upper electrode and inside the processing chamber of the etching device shown in FIG. 1.
Figure 3B:
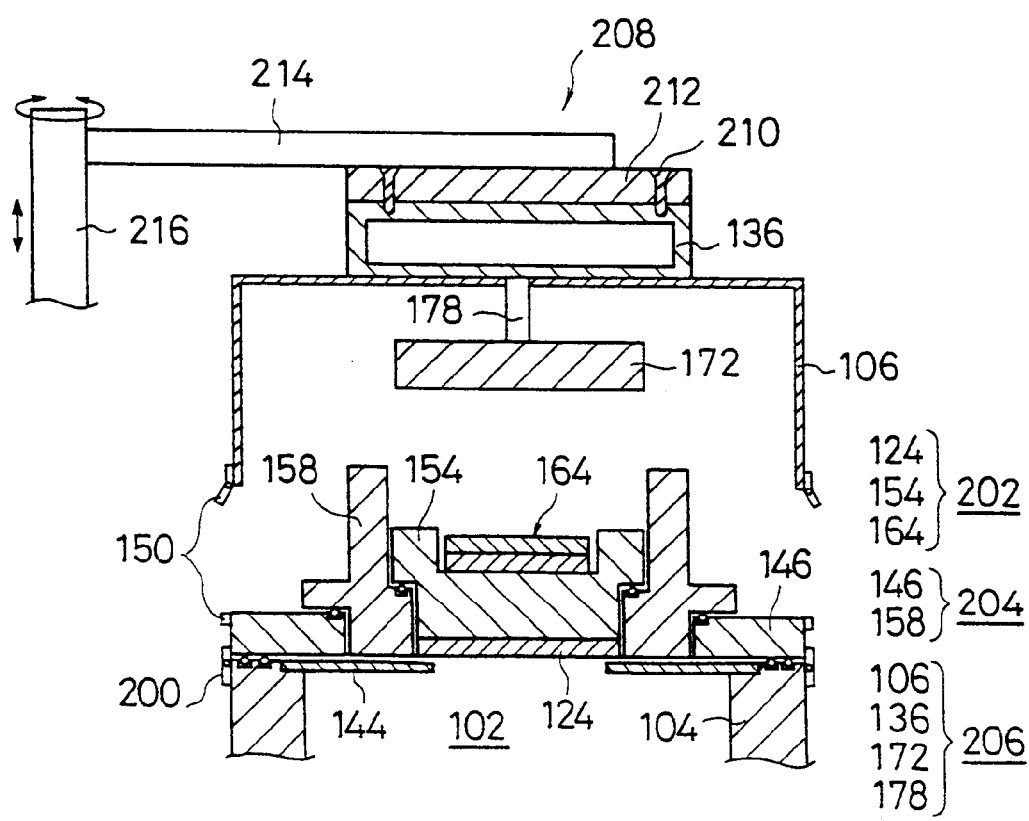

As shown in FIGS. 3(a) and 3(b), the plate unit 212 of the removing mechanism 208 is fastened to the matching box 136 by the fastening members 210. Next, the second locking mechanism 150 which secures the shield box 106 to the supporting plate 146 is released. Then, the drive shaft 216 is raised and rotated by the drive mechanism (not shown). As a result, the third assembly 206 is also raised and rotated and thus the third assembly 206 moves away from the mounting position. It is to be noted that the third assembly 206 is constituted of the matching box 136, the shield box 106, the power supply rod 178 and the electro-body 172 as explained earlier. Through this procedure, the first and second assembly 202 and 204 become exposed. This procedure is enabled since the electro-body 172 of the third assembly 206 and the cooling plate 154 of the first assembly 202 are not secured to each other via screws or the like.

Figure 4A:
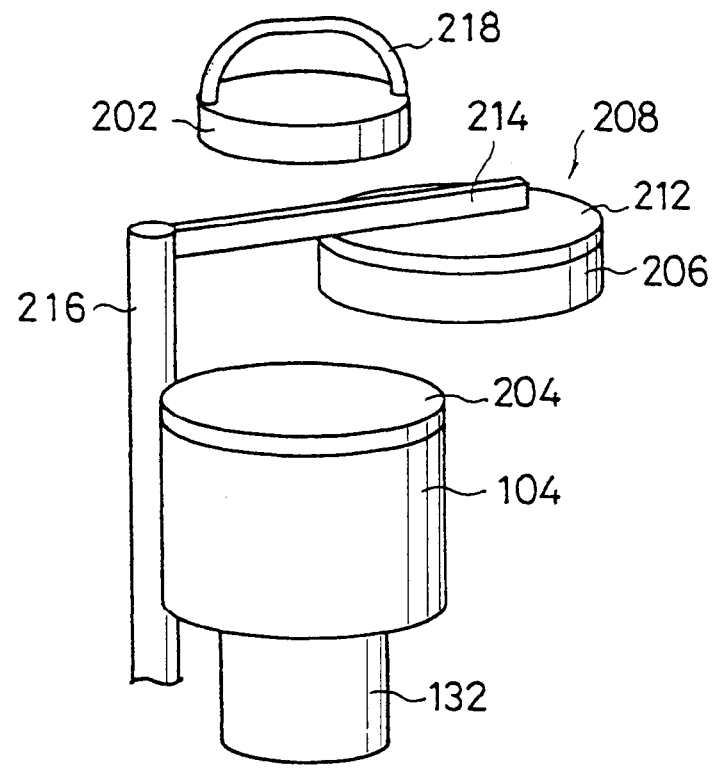
FIG. 4 schematically illustrates a step implemented to perform maintenance on the upper electrode and inside the processing chamber of the etching device shown in FIG. 1.
Figure 4B:
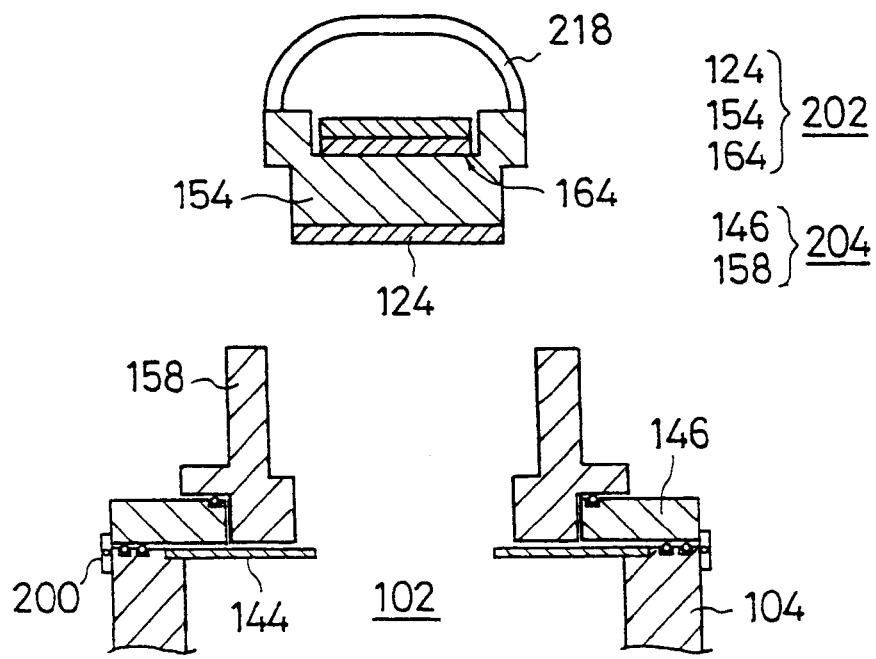

Next, a jig 218 is mounted at the cooling plate 154 housed inside the insulator 158 as shown in FIGS. 4(a) and 4(b). By using the jig 218, the maintenance worker disengages the first assembly 202 by hand. It is to be noted that the first assembly 202 is constituted of the cooling plate 154, the upper electrode 124 and the baffle plate 164 as explained earlier. Thus, only the second assembly 204 is left on the processing chamber 102. A specific type of maintenance work is performed on the disengaged first assembly 202. For instance, if reaction products and the like formed during the process are adhering to the upper electrode 124, the upper electrode 124 should be cleaned. Or if the upper electrode 124 has become worn due to plasma collisions, the upper electrode 124 should be replaced. It is to be noted that when the first assembly 202 is serviced, the first assembly 202 is reinstalled into the original state by performing a procedure which is a reversal of the procedure described above.

Figure 5A:
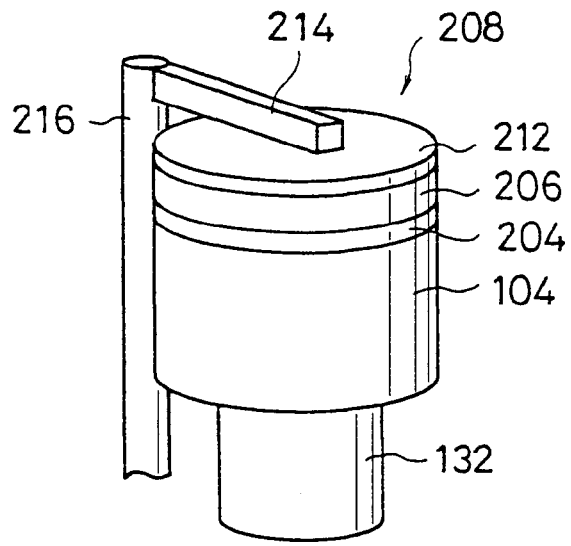
FIG. 5 schematically illustrates a step implemented to perform maintenance on the upper electrode and inside the processing chamber of the etching device shown in FIG. 1.
Figure 5B:
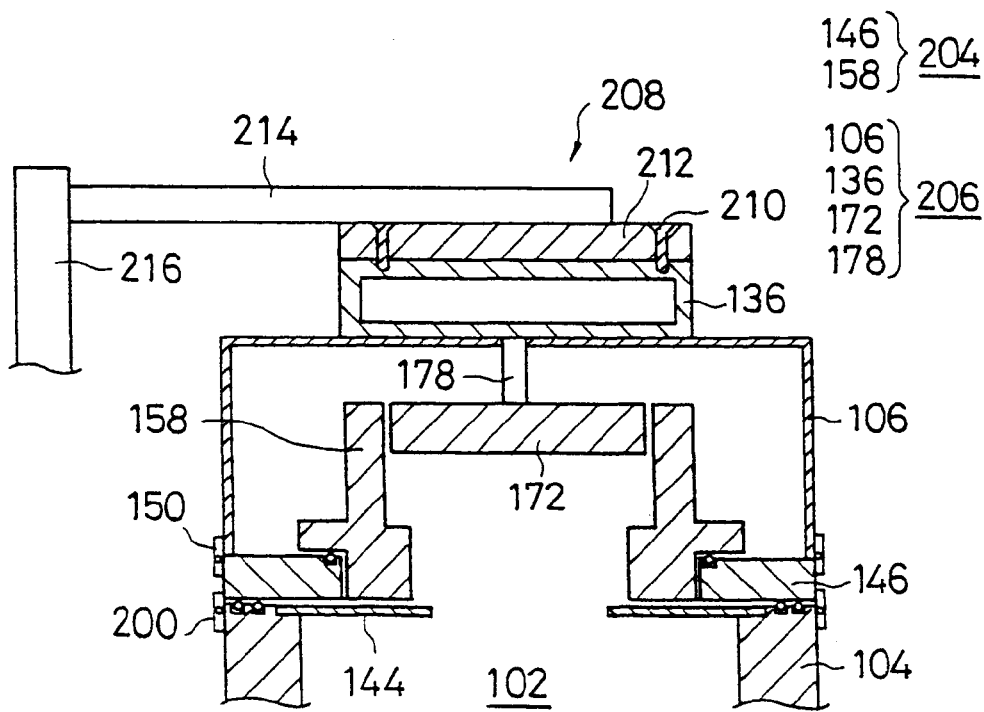

Next, as shown in FIGS. 5(a) and 5(b), the drive shaft 216 is rotated and lowered while the first assembly 202 is still disengaged. Then, the third assembly 206 is mounted at the second assembly 204, and the shield box 106 and the supporting plate 146 are secured by the second locking mechanism 150.

Figure 6A:
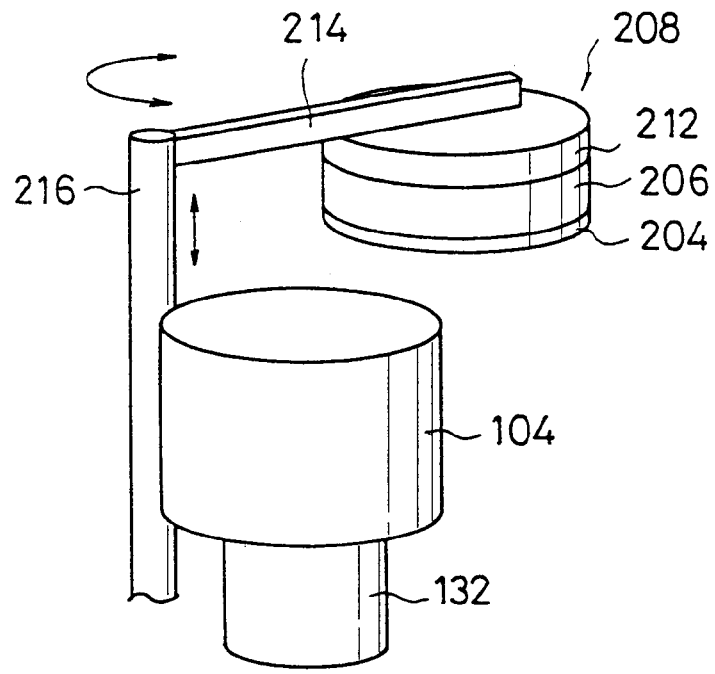
FIG. 6 schematically illustrates a step implemented to perform maintenance on the upper electrode and inside the processing chamber of the etching device shown in FIG. 1.
Figure 6B:
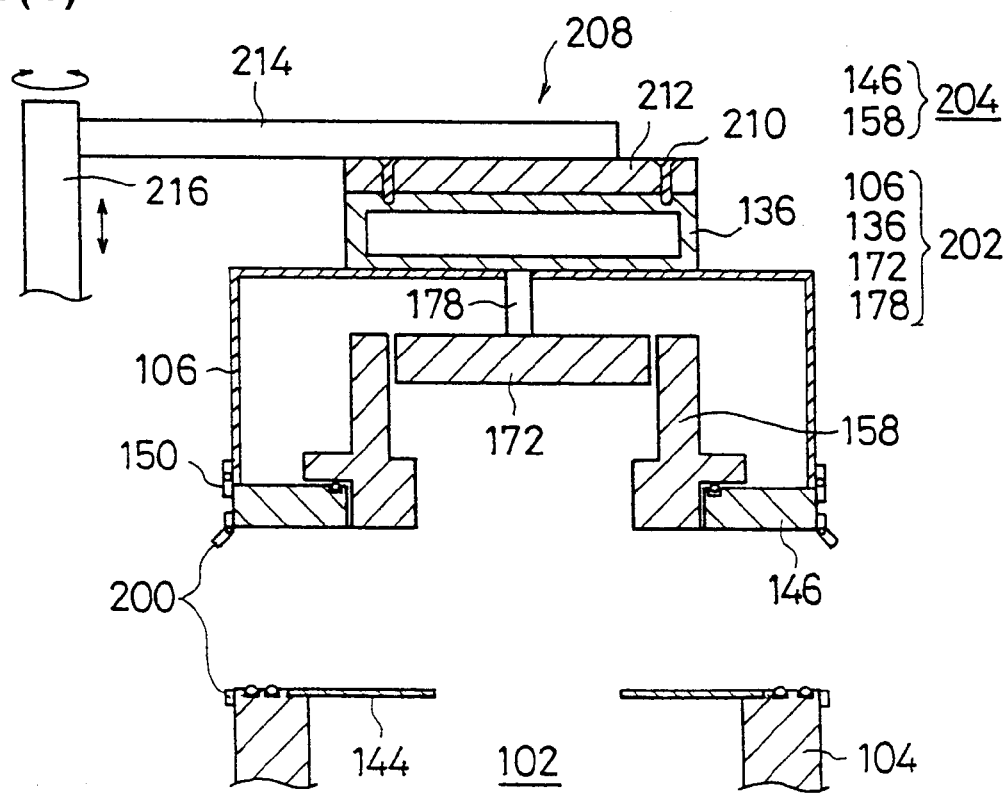

In the next step, the first locking mechanism 200 securing the supporting plate 146 and the processing container 104 is released, as shown in FIG. 6(a) and 6(b). Then, the drive shaft 216 is rotated and moved upwards again to move the second assembly 204 away from its mounting position together with the third assembly 206. As a result, the processing chamber 102 becomes opened. Then, the worker removes the shield ring 144 provided inside the processing chamber 102 to completely open up the processing chamber 102. Next, the processing chamber 102 is serviced to, for instance, clean any matter adhering to the inner wall of the processing container 104. During this process, the disengaged shield ring 144, too, can be serviced.

When the specific maintenance work is completed, the first~third assemblies 202, 204 and 206 are remounted through a procedure which is a reversal of the procedure described above. Namely, first, the shield ring 144 is fitted at a sidewall of the processing chamber 102 as shown in FIGS. 6(a) and 6(b). Next, the second and third assemblies 204 and 206 having been moved out of the way are placed upon the processing container 104, as shown in FIGS. 5(a) and 5(b). In the next step, the supporting plate 146 is secured to the processing container 104 with the first locking mechanism 200. Then, the second locking mechanism 150 is released to allow the third assembly 206 alone to move away from its mounting position. Next, as shown in FIGS. 4(a) and 4(b), the first assembly 202 is mounted at the second assembly 204. In the following step, as shown in FIGS. 3(a) and 3(b), the third assembly 206 having been moved out of the way is mounted at the second assembly 204 to restore the state illustrated in FIG. 2. Then, the shield box 106 and the supporting plate 146 are secured by employing the second locking mechanism 150. Thus, the first~third assemblies 202, 204 and 206 are remounted at the etching device 100.

In the example described above, the upper electrode 124 and the processing chamber 102 are both serviced. However, the upper electrode 124 alone may be serviced as described below. Namely, the first assembly 202 is disengaged through steps equivalent to those in FIGS. 3(a) and 3(b) and FIGS. 4(a) and 4(b) explained earlier. Then, maintenance work is performed on the upper electrode 124 of the disengaged first assembly 202. After the first assembly 202 has been serviced it is remounted at the second assembly 204. During this process, by mounting a spare first assembly 202 which has already been serviced at the second assembly 204 instead of remounting the disengaged first assembly 202, the length of time required for the maintenance work is reduced. Then, the third assembly 206 is mounted as illustrated in FIG. 2 to complete the maintenance process.

The embodiment assumes the structure described above. In this structure, the upper electrode unit 103 is constituted of three separate assemblies, i.e., the first~third assemblies 202, 204 and 206, that are each provided as an integrated unit. In addition, the second and third assemblies 204 and 206, which are heavy and large, are moved by utilizing the removing mechanism 208. Thus, the onus placed on the maintenance worker is reduced. Furthermore, the first assembly 202 is pulled upward off the second assembly 202*[1] by the maintenance worker. This allows the operator to maintain a better work posture. Moreover, it is not necessary to mount or dismount the fastening members when mounting/dismounting the first~third assemblies 202, 204 and 206. Consequently, a great reduction is achieved in the length of time required for the maintenance work.

Second Embodiment

Next, an embodiment in which the base frame of the plasma processing apparatus and the installation method thereof according to the present invention are adopted in an etching device and an installation method thereof is explained in reference to FIGS. 7~11.

(1) Structure of Base Frame

Figure 7:
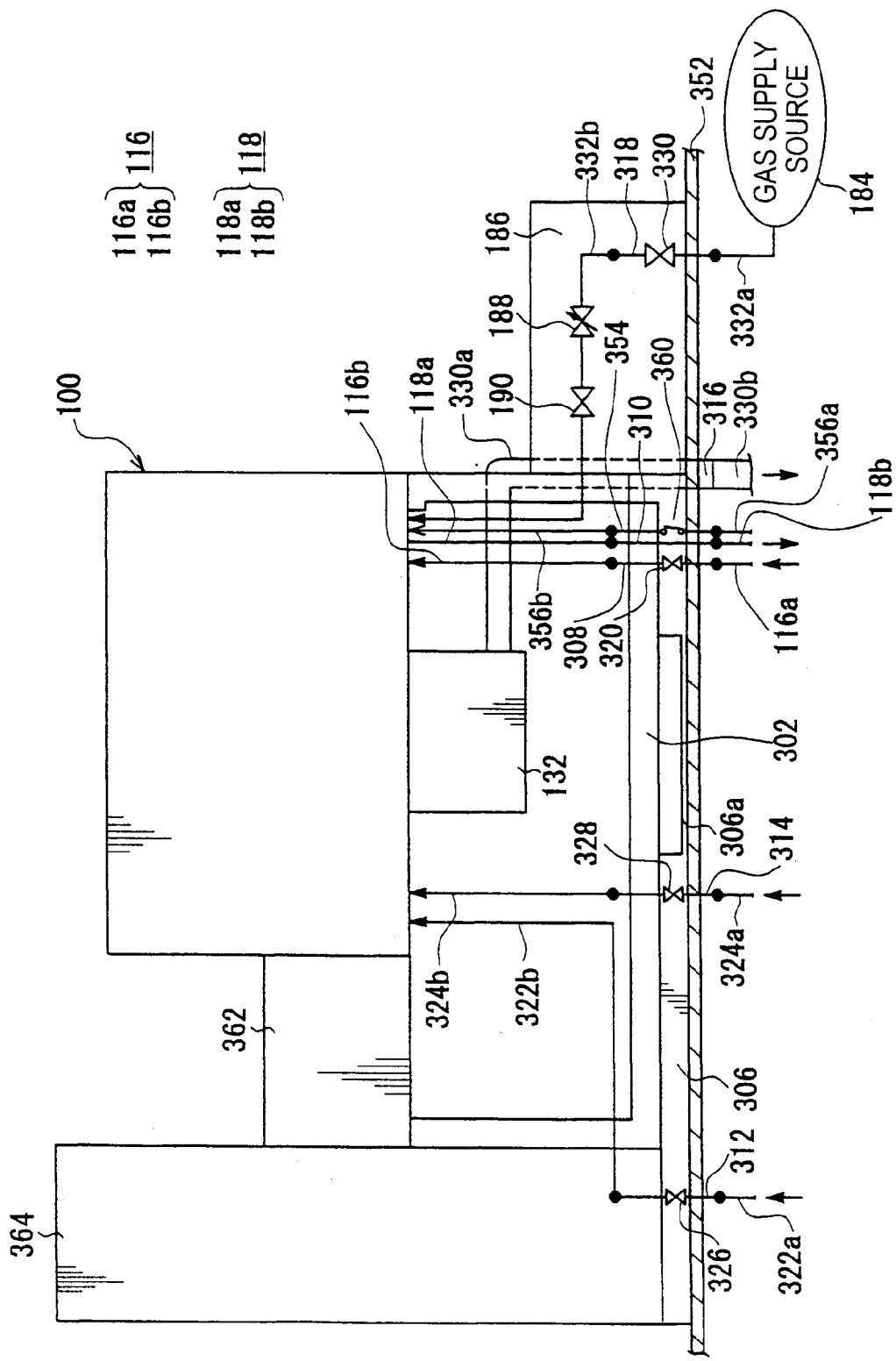
FIG. 7 schematically illustrates the base frame of the etching device in FIG. 1.

As shown in FIG. 7, an etching device 100 is installed on a base on which various devices are installed, e.g., on a floor 352 of a clean room, together with a load lock device 362, by utilizing a process ship (casters) 302 and a base frame 306. The load lock device 362, which connects the etching device 100 to a delivery device 364, includes a delivery path through which a wafer W is delivered. The process ship 302 also functions as a supporting frame which supports the etching device 100 and the load lock device 362. The process ship 302, which is provided with detachable casters 370, is allowed to move freely.

Figure 8:
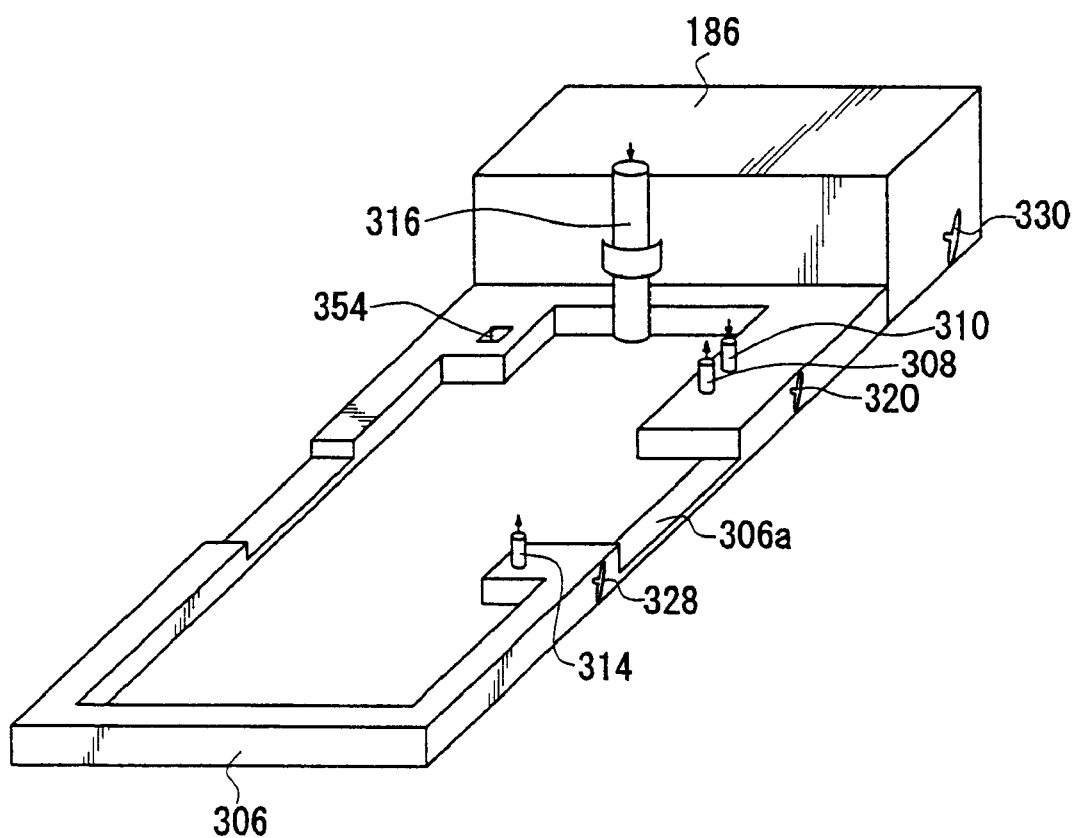
FIG. 8 is a schematic perspective of the base frame in FIG. 7.

The base frame 306 supports the process ship 302 and the delivery device 364. It is to be noted that the delivery device 364 may be installed on the floor 352 instead of on the base frame 306. In addition, the base frame 306 should be constituted of a material such as a steel material that has sufficient strength to withstand the heavy load which includes the weight of the etching device 100, the load lock device 362 and the delivery device 364 and should be formed in a rough frame shape, as illustrated in FIG. 8. It is to be noted that while the base frame 306 is formed as an integrated unit in the sample shown in FIG. 8, it may be constituted of two or three separate parts instead. In addition, a staged portion 306a is formed at the base frame 306. The staged portion 306a has a thickness smaller than the thickness at the remaining portion of the base frame 306. This structure allows the process ship 302 to pass over the base frame 306.

In addition, as shown in FIGS. 7 and 8, the base frame 306 is internally provided with or mounted with first~fifth link pipings 308, 310, 312, 314 and 316. By adopting this structure, the various pipes to be detailed later which are provided to supply specific types of gases and liquids to the etching device 100 can be connected instantly. The first~fifth link pipings 308, 310, 312, 314 and 316 are pre-designed and pre-installed in conformance to the connecting positions at which the pipings are connected to the etching device 100.

As illustrated in FIG. 7, a first feed pipe 116a and a second feed pipe 116b through which the coolant is supplied from a coolant tank (not shown) to the coolant circulating passage 110 are connected to the first link piping 308. A first drain pipe 118a and a second drain pipe 118b through which the coolant is drained into the coolant tank from the coolant circulating passage 110 are connected to the second link piping 310. A first gas supply pipe 322a and a second gas supply pipe 322b for supplying dry air from a gas supply source (not shown) to the etching device 100 are connected to the third link piping 312. A third gas supply pipe 324a and a fourth gas supply pipe 324b through which an inert gas is supplied from a gas supply source (not shown) into the processing chamber 102 are connected to the fourth link piping 314. A first evacuating pipe 330a and a second evacuating pipe 330b through which discharged gas is evacuated from the turbo-molecular pump 132 mentioned earlier to a dry pump (not shown) are connected to the fifth link piping 316.

Switching valves 320, 326 and 328 each constituting a means for switching are provided respectively at the first link piping 308, the third link piping 312 and the fourth link piping 314. The switching valves 320, 326 and 328 are all internally mounted at the base frame 306. In this structure, by leaving the switching valves 320, 326 and 328 in a closed state, the gases and the like can be supplied to the first, third and fourth by the link pipings 308, 312 and 314 before the etching device 100 is installed. As a result, the gas and the like can be promptly supplied after the etching device 100 is installed.

In addition, as shown in FIGS. 7 and 8, the gas box 186 explained earlier is secured at the base frame 306. A sixth link piping 318 is provided at the gas box 186. A fifth gas supply pipe 332a and a sixth gas supply pipe 332b through which the processing gas is supplied from the gas supply source 184 into the processing chamber 102 are connected to the sixth link piping 318. A switching valve 330 internally mounted at the gas box 186 is provided at the sixth link piping 318. It is to be noted that while only a single gas supply system is shown inside the gas box 186 in FIG. 7, a plurality of gas supply systems, the number of which corresponds to the number of gases constituting the processing gas to be supplied into the processing chamber 102 are provided in the gas box 186 in reality.

The base frame 306 is also internally provided with a link wiring 354 as shown in FIGS. 7 and 8. A first wiring 356a and a second wiring 356b through which power output from a source (not shown) is supplied to the etching device 100 are connected to the link wiring 354 as illustrated in FIG. 7. In this structure, the wirings through which the power is supplied to the etching device 100, too, can be connected instantly. Furthermore, the link wiring 354 is pre-designed and pre-installed in conformance to the position at which the wiring is connected at the etching device 100. A switch 360 constituting an on/off means is provided at the link wiring 354, as illustrated in FIG. 7. The switch 360 is internally mounted at the base frame 306. This structure allows power to be supplied to the link wiring 354 before the etching device 100 is installed as long as the switch 360 is turned off. As a result, it is possible to supply power promptly after the etching device 100 is installed.

It is to be noted that although not shown, link pipings and a link wiring structured roughly identically to those described above are provided in conjunction with the load lock device 362 as well at the base frame 306. In addition, pipes for supplying and draining the fluids in a manner similar to that described above and a power supply source are connected to these link pipings and link wirings. A switching valve or a switch is provided at each of the link pipings and the link wiring as necessary as well.

(2) Method of Processing Device Installation

Figure 9:
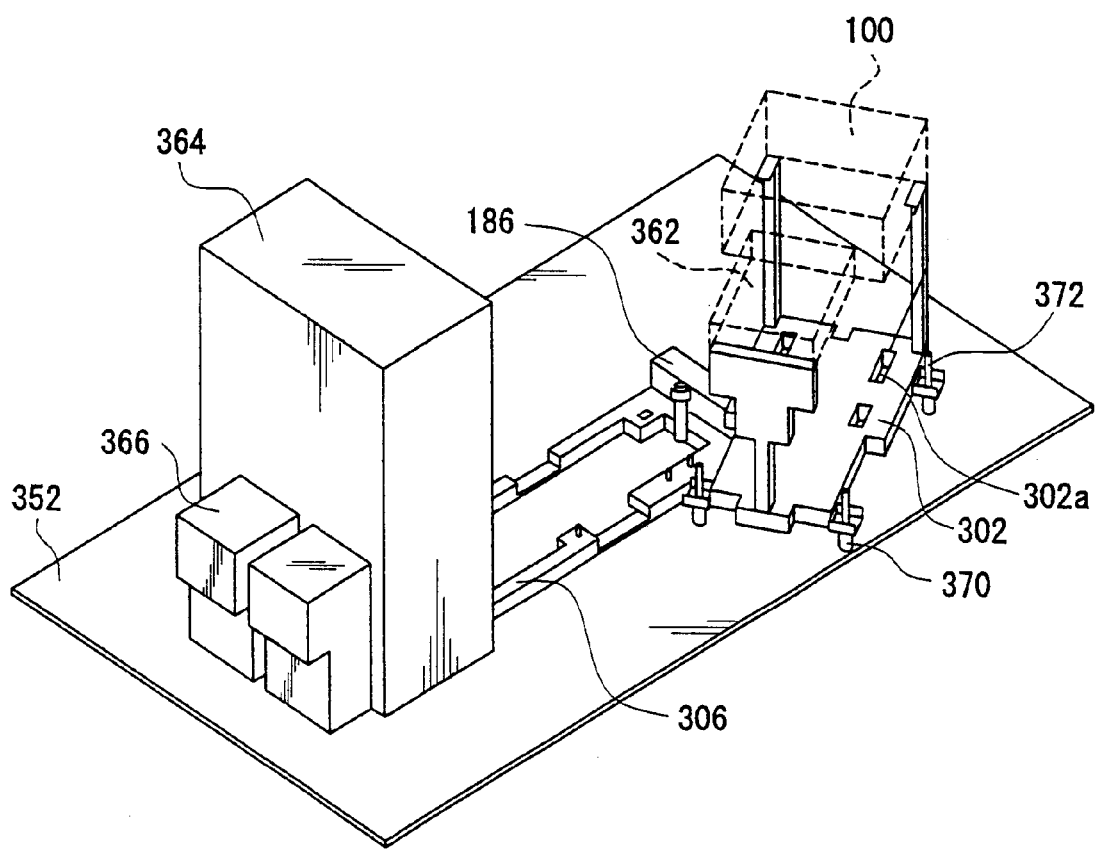
FIG. 9 schematically illustrates a method for installing the etching device shown in FIG. 1.
Figure 10:
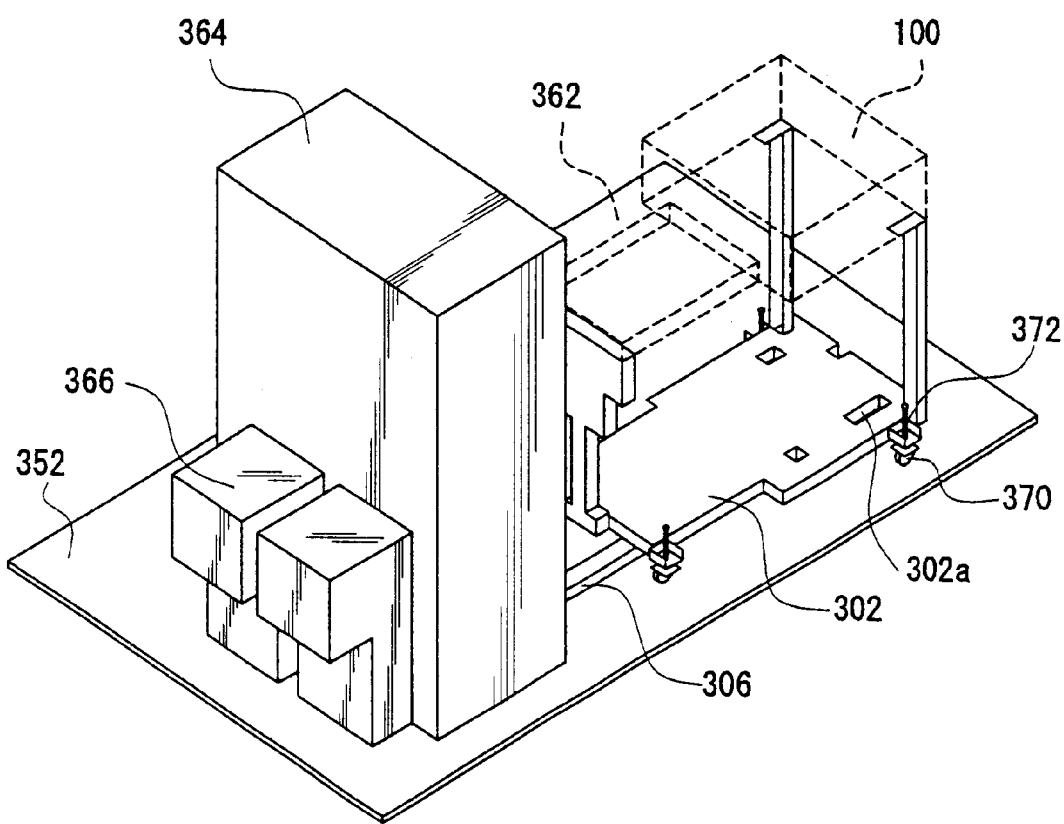
FIG. 10 schematically illustrates the method for installing the etching device shown in FIG. 1.

Next, the method of installing the etching device 100 is explained. First, as shown in FIGS. 7 and 9, the base frame 306 is secured to the floor 352 of the clean room by using earthquake-proof metal fixtures such as bolts. In addition, before installing the etching device 100 and the like, the first~sixth pipes 116a, 118b, 322a, 324a, 332a and 330b connected to the gas/liquid supply sources and the fluid source constituted of a vacuum pump and the first wiring 356a connected to the power supply source are buried under the floor of the clean room, for instance, as shown in FIGS. 7 and 8. Then, the first~sixth pipes 116a, 118b, 322a, 324a, 332a and 330b and the first wiring 35a are respectively connected to the first~sixth link pipings 308, 310, 312, 314, 316 and 318 and the link wiring 354.

Next, as shown in FIG. 9, the delivery device 364 is set on the base frame 306. It is to be noted that if the delivery device 364 is not to be installed on the base frame 306, the delivery device 364 should be installed on the floor 352. In addition, a delivery mechanism (not shown) which delivers the wafer W is provided inside the delivery device 364. Subsequently, a cassette chamber 366 is connected to the delivery device 364. The cassette (not shown) to house the wafer W is provided inside the cassette chamber 366.

Figure 11:
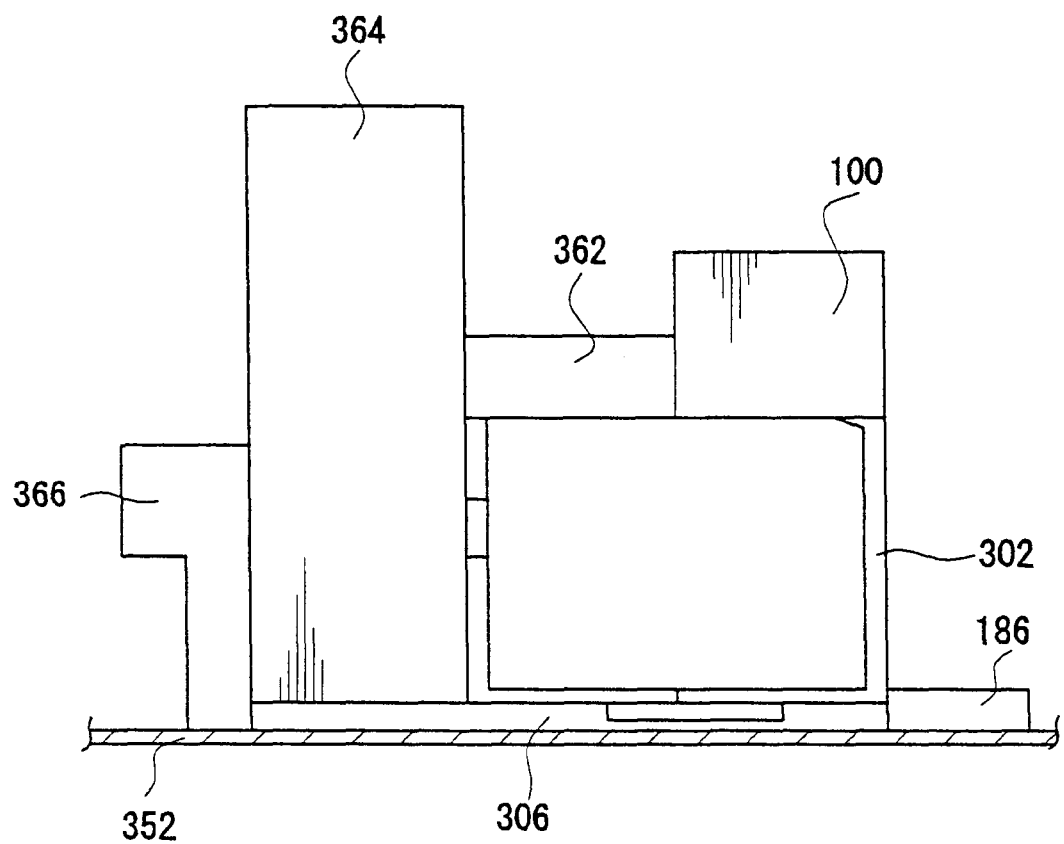
FIG. 11 schematically illustrates the method for installing the etching device shown in FIG. 1.

Next, the process ship 302 is moved close to the base frame 306. At this point, the etching device 100 and the load lock device 362 are set on the process ship 302 in a connected state. Then, as illustrated FIG. 10, the process ship 302 is set parallel to, for instance, the base frame 306. In the next step, the process ship 302 is aligned so as to allow the delivery device 364 to be connected with the load lock device 362 as shown in FIG. 11. Afterward, an elevator mechanism 372 connected to the casters 370 is lowered to set the process ship 302 on the base frame 306. Next, the casters 370 are taken off and the process ship 302 is secured to the base frame 306 with the earthquake proof metal fixture and the like. It is to be noted that the process ship 302 may be secured to the floor 352 instead. In addition the load lock device 362 is connected to the delivery device 364.

Then, as illustrated in FIG. 7, the pipes 116b, 118a, 322b, 324b, 332b and 330a and the second wiring 356b already connected to the etching device 100 are respectively connected to the first~sixth link pipings 308, 310, 312, 314, 316 and 318 and the link wiring 354. During this process, the individual connections are made via a through opening 302a provided at the process ship 302.

The embodiment adopting the structure described above allows the base frame 306, which is provided to support the etching device 100 and the like, to be secured to the base before the etching device 100 and the like are brought to the installation site, e.g., while the etching device 100 and the like are being manufactured. In addition, the pipes 116a, 118b, 322a, 324a, 332a and 330b on the fluid source side which require difficult piping work can be laid out and connected to the first~sixth link pipings 308, 310, 312, 314, 316 and 318 in advance during the production. As a result, the length of time to elapse between the installation of the etching device 100 and the like and the start of the actual operation is greatly reduced. Furthermore, as long as the switching valves 320, 326, 328 and 330 remain closed, the gases and the like do not leak before the etching device 100 is connected.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the first embodiment on an assumption that the upper electrode unit is constituted of the first~third assemblies and that specific members such as the cooling plate and the like are included in the individual assemblies, the present invention is not restricted by these details. The present invention may be adopted when the number of assemblies is two or four or more or when members included in the individual assemblies are different from those in the embodiment, as well.

In addition, while an explanation is given above in reference to the first embodiment on an example in which the position of the second assembly is set by utilizing the first locking mechanism, the present invention is not limited to this example. For instance, the second assembly can be set at a specific position by fitting an indentation and/or a projection formed at the lower surface of the supporting plate with a projection and/or an indentation formed at the top surface of the processing container, without having to utilize the first locking mechanism. It is to be noted that in such a case, too, a high degree of air-tightness is maintained at the processing container due to the weight of the assemblies and the difference between the pressure inside the processing chamber and the pressure outside the processing chamber.

While an explanation is given above in reference to the first embodiment on a structural example that adopts the first and second locking mechanisms each constituted of a buckling mechanism, the present invention is not restricted by these structural details. The present invention may be adopted in conjunction with locking mechanisms constituted of other mechanisms as long as the second assembly and the processing container or the second assembly and the third assembly can the positioned relative to each other and secured.

Also, while an explanation is given above in reference to the first embodiment on a structural example in which the insulator is supported by the supporting plate, the present invention is not restricted by these details either. The present invention may be adopted by, for instance, securing the insulator to the supporting plate via a retaining member as well.

While an explanation is given above in reference to the first embodiment on a structural example in which the removing mechanism is secured to the matching box only for maintenance, the present invention is not limited to this example. The present invention may be implemented by leaving the removing mechanism and the matching box in a locked state at all times instead.

While an explanation is given above in reference to the first embodiment on an example in which high-frequency power is applied to the upper electrode, the present invention is not limited to this example. The present invention may be adopted in conjunction with an upper electrode that constitutes a ground electrode, instead.

While an explanation is given above in reference to the first embodiment on a structural example in which the electrobody, the power supply rod and the like constitute a power supply path, the present invention is not restricted to these structural details. The present invention may be instead implemented by constituting a grounding path with the electro-body, the power supply rod and the like.

In addition, while an explanation is given above in reference to the second embodiment, on a structural example in which link pipings for supplying specific gases or fluids are provided at the base frame, the present invention is not restricted to such structural details. The present invention may be implemented by providing a link piping through which any type of fluid required in a plasma processing device is supplied at the base frame. Furthermore, the number of link pipings and the number of link wirings provided at the base frame can be adjusted as necessary in conformance to the design of a given processing device.

While an explanation is given above in reference to the second embodiment on an example in which the link pipings and the link wiring are internally provided or externally mounted at specific positions of the base frame, the present invention is not restricted to these details. The present invention may be implemented by internally providing or externally mounting the link pipings and the link wiring as appropriate at the base frame in conformance to the design of a given processing device.

While an explanation is given above in reference to the second embodiment on a structural example in which a unit achieved by connecting the load lock device to the etching device is connected to the delivery device, the present invention is not restricted to these details, and it may be adopted when installing a single processing device or a plurality of various processing devices each requiring link pipings and link wirings to be connected thereto in a connected state.

Furthermore, while an explanation is given in reference to the first and second embodiments on an example in which the present invention is adopted in a plane parallel plate etching device, the present invention is not limited to this example. The present invention may be adopted in any of various types of plasma processing devices including magnetron plasma processing devices and inductively coupled plasma processing devices as well. In addition, the present invention may be adopted in an apparatus that performs various types of plasma processing including ashing and film formation processing. Moreover, it may be adopted in an apparatus that performs processing on a glass substrate to constitute an LCD.

The present invention makes it possible for the maintenance worker to assume a better work posture while performing maintenance work on the electrode or inside the processing chamber. In addition, the heavy and large members do not need to be mounted or dismounted by the maintenance worker. As a result, the onus placed on the worker is reduced. Furthermore, the work process to be carried out by the maintenance worker is greatly simplified and thus, the length of time required for the maintenance work is reduced. In addition, in another aspect of the present invention, the length of time to elapse between the plasma processing device installation and the start of the actual operation of the device is reduced. Thus, the production of can be started promptly.

INDUSTRIAL APPLICABILITY

The present invention can be adopted in a plasma processing device and, more specifically, in a plasma etching device, a plasma ashing device and a plasma CVD (chemical vapor deposition) device.

Amendments

The electro-body 172 is internally provided with a gas supply path 172b. As a result, when it is mounted, the processing gas supplied from a gas supply source 184 such as a fluorocarbon gas is supplied to the baffle plate 164 via a flow-regulating valve 188 and a switching valve 190 housed inside a gas box 186 and a switching valve 192, a gas inlet 194 and the gas supply path 172b provided inside the shield box 106. The electro-body 172 is also internally provided with a coolant circulating passage 172c. Through the coolant circulating passage 172c, the coolant circulates. The coolant absorbs the heat generated at the upper electrode 124 during the process. As a result, the temperature of the upper electrode 124 is sustained at a predetermined level. An O-ring 195 for sustaining the air-tightness and an electrically conductive O-ring 182 for assuring electrical conductivity are provided between the electro-body 172 and the cooling plate 154.

EXPLANATION OF REFERENCE NUMERALS 100 etching device
102 processing chamber
103 upper electrode unit
106 shield box
108 lower electrode
124 upper electrode
134 high frequency source
136 matching box
138 matcher
146 supporting plate
150 second locking mechanism
154 cooling plate
158 insulator
164 baffle plate
172 electro-body
178 power supply rod
200 first locking mechanism
202 first assembly
204 second assembly
206 third assembly
208 removing mechanism
306 base frame
308, 310, 312, 314, 316, 318 first~sixth link pipings
320, 326, 328, 330 switching valve
354 link wiring
360 switch
W wafer

What is claimed is:

1. A plasma processing device comprising:
   a processing chamber for implementing a plasma process on a workpiece, said processing chamber comprising an upper wall including an upper electrode unit; and
   a removing mechanism configured to disengage said upper electrode unit from said processing chamber,
   wherein said upper electrode unit comprises:
      a first assembly having one of an electrode for supplying high-frequency power into said processing chamber and a grounded electrode,
      a second assembly holding said first assembly, and
      a third assembly having one of a supply path through which said high-frequency power is supplied and a grounding path,
      wherein said removing mechanism is configured to disengage said first assembly, said second assembly, and said third assembly independently of one another or as an integrated unit.

2. The plasma processing device of claim 1, further comprising:
   a first locking mechanism for connecting said second assembly to a processing container; and
   a second locking mechanism connecting said second assembly to said third assembly,
   wherein said removing mechanism is configured to disengage said third assembly alone with said second locking mechanism released while keeping said processing container and said second assembly in a connected state with said first locking mechanism.

3. The plasma processing device of claim 1, wherein said first assembly is configured to disengage without employing said removing mechanism after said third assembly is disengaged.

4. The plasma processing device of claim 1, further comprising:
   a first locking mechanism for connecting said second assembly to a processing container; and
   a second locking mechanism connecting said second assembly to said third assembly,
   wherein said removing mechanism is configured to disengage at least said second assembly and said third assembly as an integrated unit with said first locking mechanism released while keeping said second assembly and said third assembly in a connected state with said second locking mechanism.

5. A method of performing maintenance on a plasma processing device comprising a processing chamber for performing a plasma process on a workpiece, said processing chamber comprising an upper wall including an upper electrode unit, and a removing mechanism for disengaging said upper electrode unit from said processing chamber, wherein said upper electrode unit comprises at least a first assembly, a second assembly, and a third assembly, the method comprising:
   securing said third assembly to said removing mechanism and disengaging said third assembly;
   disengaging said first assembly without using said removing mechanism;
   coupling said third assembly with said second assembly to achieve an integrated unit;
   securing said integrated unit to said removing mechanism and disengaging said integrated unit; and
   performing maintenance on at least one of said first assembly, said second assembly, said third assembly, and said processing chamber.

6. The method of performing maintenance on a plasma processing device of claim 5,
   wherein said first assembly comprises one of an electrode for supplying high-frequency power into said processing chamber and a grounded electrode, said second assembly holds said first assembly, and said third assembly comprises one of a supply path through which said high-frequency power is supplied and a grounding path.

7. A method of performing maintenance on a plasma processing device comprising a processing chamber for performing a plasma process on a workpiece, said processing chamber comprising an upper wall including an upper electrode unit, and a removing mechanism for disengaging said upper electrode unit from said processing chamber, wherein said upper electrode unit comprises at least a first assembly having an original position and a second assembly having an original position, the method comprising:

- securing said first assembly to said removing mechanism and disengaging said first assembly;
- disengaging said second assembly without using said removing mechanism;
- servicing said second assembly after disengaging said second assembly;
- reinstalling said second assembly to the original position after servicing said second assembly without using said removing mechanism; and
- reinstalling said first assembly to the original position.

8. The method of performing maintenance on a plasma processing device of claim 7, wherein said first assembly comprises one of an electrode for supplying high-frequency power into said processing chamber and a grounded electrode, and said second assembly holds said first assembly.

* * * * *